United States Patent [19]

Brantingham et al.

[11] 4,344,148
[45] * Aug. 10, 1982

[54] SYSTEM USING DIGITAL FILTER FOR WAVEFORM OR SPEECH SYNTHESIS

[75] Inventors: George L. Brantingham, Plano; Richard H. Wiggins, Jr., Dallas, both of Tex.

[73] Assignee: Texas Instruments Incorporated, Dallas, Tex.

[*] Notice: The portion of the term of this patent subsequent to Jun. 24, 1997, has been disclaimed.

[21] Appl. No.: 124,174

[22] Filed: Feb. 25, 1980

Related U.S. Application Data

[60] Division of Ser. No. 905,328, May 12, 1978, Pat. No. 4,209,844, which is a continuation of Ser. No. 807,461, Jun. 17, 1977, abandoned.

[51] Int. Cl.³ .................... G06F 15/34; G10L 1/00
[52] U.S. Cl. ........................... 364/724; 179/1 SA; 179/1 SM
[58] Field of Search .......... 364/724; 179/1 SA, 1 SG, 179/1 SM

[56] References Cited

U.S. PATENT DOCUMENTS

| | | | |
|---|---|---|---|
| 3,662,115 | 5/1972 | Saito et al. | 179/1 SA |
| 3,703,632 | 11/1972 | Shanks | 364/724 |
| 3,908,085 | 9/1975 | Gagnon | 179/1 SG |
| 3,975,587 | 8/1976 | Dunn et al. | 179/1 SA |
| 4,022,974 | 5/1977 | Kohut et al. | 179/1 SM |
| 4,052,563 | 10/1977 | Noda et al. | 179/1 SA |
| 4,058,676 | 11/1977 | Wilkes et al. | 179/1 SA |

Primary Examiner—Jerry Smith
Attorney, Agent, or Firm—William E. Hiller; Melvin Sharp; James T. Comfort

[57] ABSTRACT

A system using a digital filter for generating complex waveforms, such as human speech. The filter has a multiplier, an adder coupled to the output of the multiplier and various delay circuits coupled to the output of the adder. A latch memory is coupled to the output of one of the delay circuits. Switching circuits are provided for the output of the delay and the latch memory to inputs of the multiplier and the adder to selected times. Coefficients of the filter are preferably stored in a memory coupled to another input of the multiplier. The excitation signal is coupled to the adder in one embodiment and to the multiplier in another embodiment.

30 Claims, 16 Drawing Figures

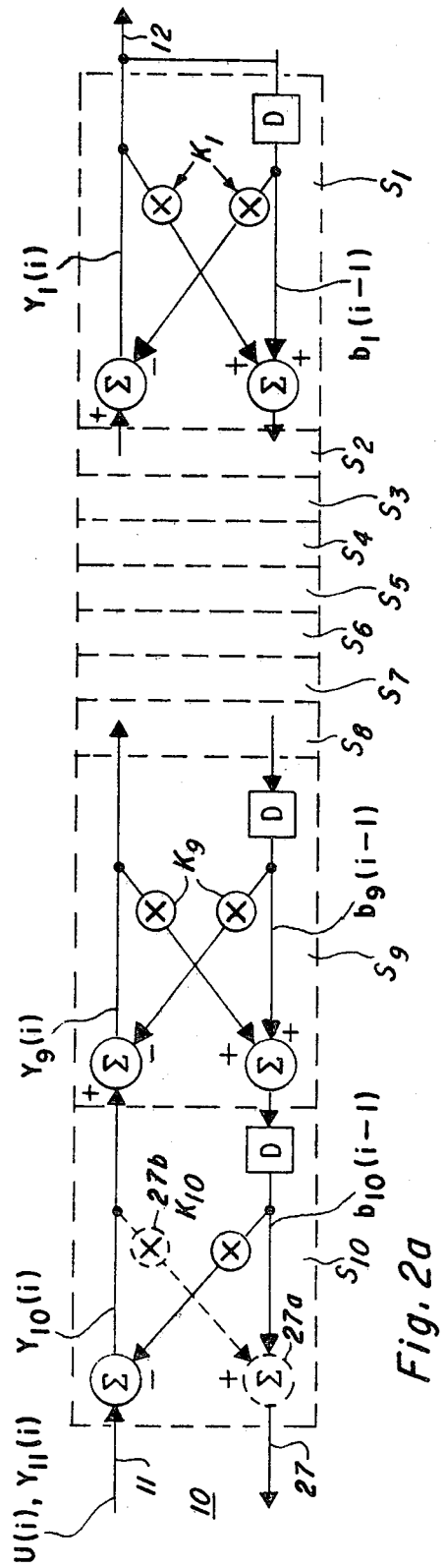
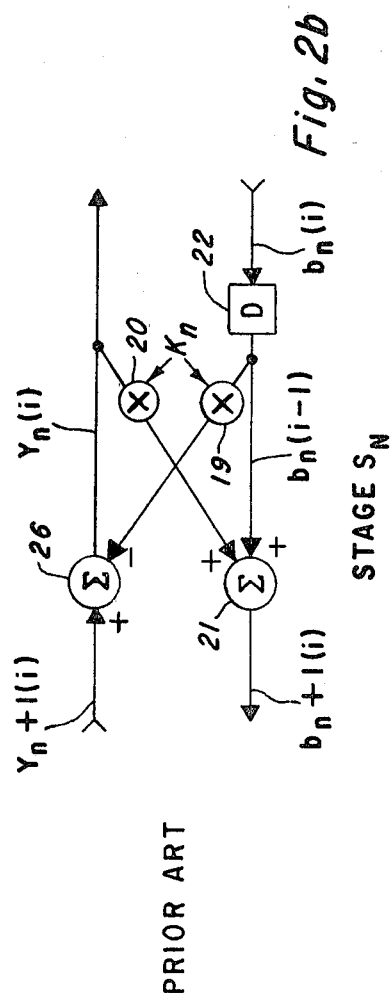
*Fig. 2a*
*Fig. 2b*
STAGE $S_N$
PRIOR ART

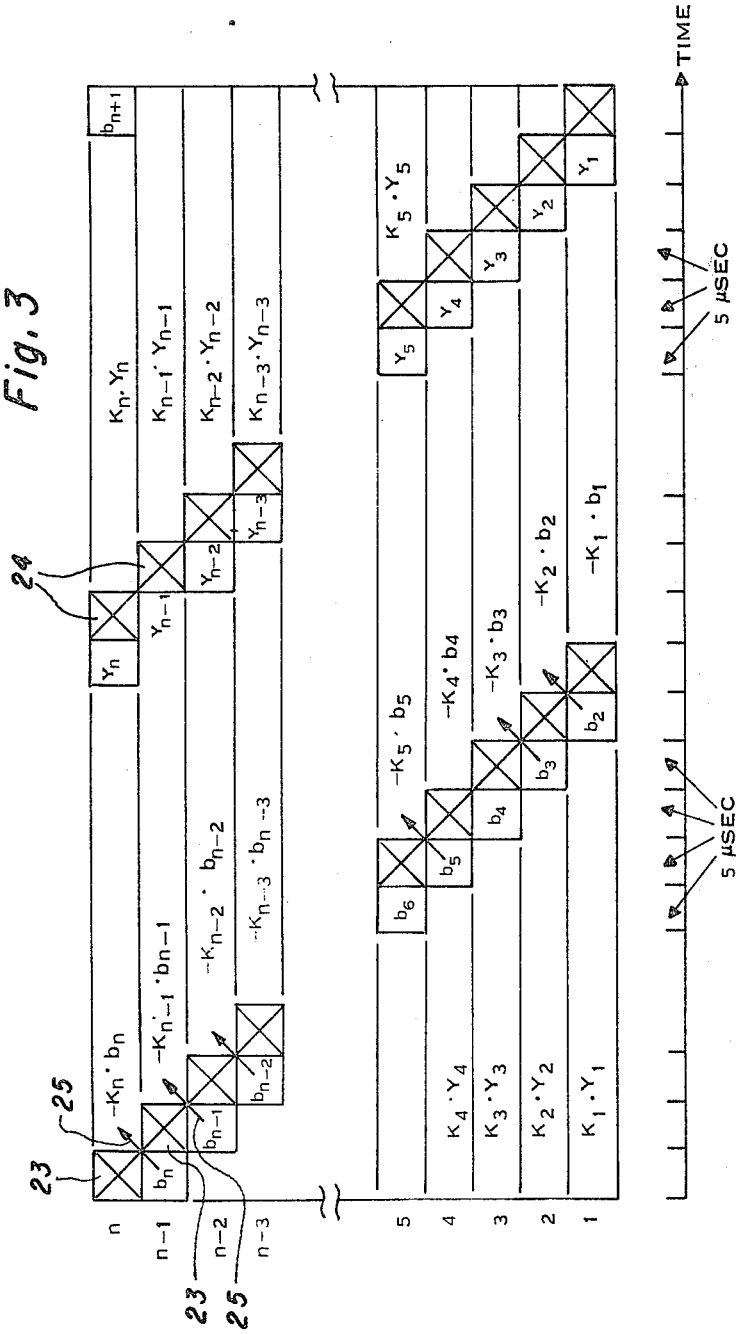

SYSTEM USING DIGITAL FILTER FOR WAVEFORM OR SPEECH SYNTHESIS

This is a division of application Ser. No. 905,328, filed May 12, 1978 and now U.S. Pat. No. 4,209,844, which was a continuation of Ser. No. 807,461 filed on June 17, 1977 and now abandoned.

BACKGROUND OF THE INVENTION

This invention relates to the generation of complex waveforms using digital signals and more specifically to the synthesis of speech by digital circuits using linear prediction methods. Disclosed is a digital filter having an array multiplier for use in speech synthesis or waveform generation circuits. The disclosed speech synthesis circuit may be integrated on a single integrated circuit, thereby facilitating its use various application in the communication handling industry, including such applications as: teaching machines, communication equipment (i.e., telephones, voice cryptographic equipment, radios, televisions, etc.), and other equipment which generate the sound of a human's voice.

Several methods are currently being used and experimented with to digitize human speech. For example, pulse code modulation, differential pulse code modulation, adaptive predictive coding, delta modulation, channel vocoders, cepstrum vocoders, formant vocoders, voice excited vocoders, and linear predictive coding methods of speech digitalization are known. These methods are briefly explained in "Voice Signals: Bit by Bit" at pages 28–34 in the October 1973 issue of IEEE Spectrum.

Computer simulations of the various speech digitalization methods have generally shown that the linear predictive methods of digitizing speech can produce speech having greater voice naturalness than the previous vocoder systems (i.e., channel vocoders) and at a lower data rate than the pulse coded modulation systems. As will be seen, the linear predictive systems often make use of a multi-stage digital filter and as the number of stages of the digital filter increases, the more natural sounding becomes the resulting generated speech.

An early application of linear predictive methods to digital speech synthesis occurred in the late 1960's and early 1970's. A historical analysis of some of this early work is set forth in Markel and Gray, "Linear Prediction of Speech" (Springer-Verlag: New York, 1976) at pages 18–20.

The multi-stage digital filter used in linear predictive coding is preferably an all pole filter with all roots preferably occurring within the unit circle $|z|=1$ when the mathematical transfer function of the filter is expressed as a Z-transform. The filter itself may take the form of a lattice filter of the type depicted in FIGS. 2a and 2b, however, other filters including ladder filters, normalized ladder filters and others are known, as set forth in Chapter 5 of "Linear Prediction of Speech". As will be seen, each stage of the lattice filter requires two addition operations, two multiplication operations and an delay operation. The filter is excited from either a periodic digital source for voiced sounds or a random digital source for unvoiced sounds. The filter coefficients are preferably updated every few milliseconds while the excitation signal is updated at a faster rate.

In the prior art, the lattice filter network of FIG. 2a has been implemented by appropriately programming large digital computers. Exemplary Fortran programming of a computer for speech synthesis purposes is set forth in the aforementioned "Linear Prediction of Speech". Given the data rate of the excitation signal and the large number of arithmetic operations, i.e., two multiplications and two additions for each stage of a multi-stage filter and given that increasing the number of stages thereof increases the naturalness of the generated speech, high speed digital computers have been utilized in most speech synthesis work done to date. However, Dr. J. G. Dunn, J. R. Cowan and A. J. Russo of the ITT Defense Communications Division in Nutley, N.J. have attempted to implement a multi-stage filter using metal oxide silicon (MOS) large scale integration techniques. They attempted using a multi-processing approach, wherein many arithmetic units are operated simultaneously; however, this technique requires a very large number of multiplier and adder circuits be implemented on a semiconductor chip. Some discussion of the work done by Dr. Dunn et al is set forth in "Progress in the Development of Digital Vocoder Employing an Itakura Adaptive Predictor" published in "Telecommunications Conference Records, I.E.E.E. Publ. No. 73" (1973). Replacing the lattice structure of FIG. 2a with various adders and multipliers results in a complex and large size semiconductor chip.

It was one object of this invention, therefore, to implement a lattice type filter for generating complex wave forms, such as human speech, on a single semiconductor chip.

It was another object of this invention, that the filter components be implemented with MOS devices.

It is still yet another object of this invention that the resulting MOS filter be of smaller size than that heretofore known in the prior art.

The foregoing objects are achieved as is now described. The digital filter includes a multiplier, one input of which receives the filter coefficients from a memory. The output of the multiplier is applied to one input of an adder/subtractor, whose output is applied to a short delay circuit. The output of the short delay circuit is applied to a long delay circuit. The short and long delay circuits preferably comprise shift registers of short and long lengths, respectively. The output of the long delay circuit is coupled to a latch memory via a switch. The other input to the multiplier is selectively coupled to the output of the adder/subtractor, the output of the short delay circuit or the output of the latch memory. The other input to the adder/subtractor is selectively coupled to the output of the latch memory, the output of the long delay circuit or the output of the adder/subtractor. The multiplier is preferably an array multiplier. The output of the filter is provided at the output of the latch memory and the input is either coupled to the adder/subtractor or the multiplier in the two disclosed embodiments.

BRIEF DESCRIPTION OF THE DRAWINGS

The novel features believed characteristic of the invention is set forth in the appended claims. The invention itself, however, as well as a preferred mode of use and further objects and features thereof, will be best understood by reference to the following detailed description of illustrious embodiments thereof when read in conjunction with the accompanying drawings, wherein:

FIGS. 2a and 2b shows a typical lattice filter of the type used in speech synthesis circuits;

FIG. 3 shows a timing arrangement for the generation of intermediate results in a lattice filter having N stages;

DETAILED DESCRIPTION

Figures 1A, 1B:
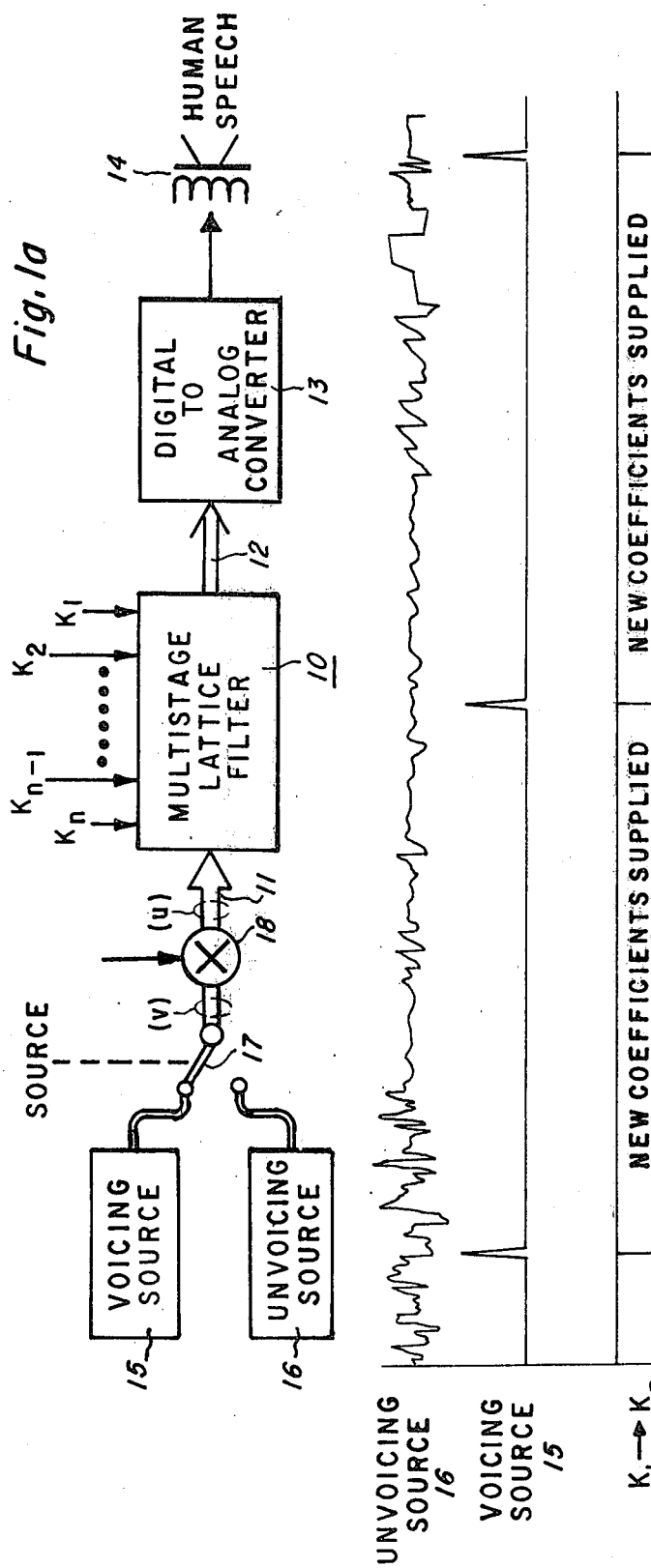
FIG. 1a is a block diagram of the basic elements of a voice synthesizer.
FIG. 1b depicts the presence of the excitation signal and $K_n$ coefficients with respect to time.

Referring now to FIG. 1a, there is shown, in block diagram form, the basic elements of a voice synthesizer system. The voice synthesis circuit comprises a multistage lattice filter 10, which digitally filters an excitation signal 11 using filter coefficients $K_1$-$K_n$. Lattice filter 10 outputs a digital signal 12 which is converted to analog form by a digital/analog converter 13. The output of converter 13 is changed to audible sounds by a speaker 14 or other such sound conversion means; it is to be understood, of course, that an amplifier may be used between converter 13 and speaker 14 to amplify the analog output of converter 13 to levels required by speaker 14.

The excitation signal (U) 11 is generally derived from one of two sources, voicing source 15 or unvoicing source 16. The particular source used is determined by a digital switch 17. Voicing source 15 is utilized when generating those sounds for which the human vocal cords or vocal folds vibrate during speech, such as the sound of the first E in Eve. The rate at which the vocal folds open and close determines the pitch of the sound generated. Unvoicing source 16 is used when generating those sounds, such as the F in Fish, where the vocal folds are held open and air is forced past them to the vocal tract. Thus, the particular source, 15 and 16, utilized depends upon the source to be generated. Typically, the unvoicing source 16 generates a random digital signal while voicing source 15 generates a periodic digital signal. The digital data supplied by voicing source 15 and unvoicing source 16 may, of course, be merely stored in one or more semiconductor read-only-memories (ROM's). Preferably, however, such data is stored in an encoded format, e.g., as pitch or a code actuating a random number generator. Thus, such data is usually first decoded before the random or periodic data (e.g., Signal V) is supplied to filter 10. Of course, depending on how such data is stored, the need for switch 17 may be eliminated. When the data is stored as pitch or a code activating a random number generator, a amplification factor (A) is preferably also stored in the ROM. Amplification factor A adjusts the constant amplitude signal (V) from voicing source 15 or unvoicing source 16 to produce the excitation signal (V) for filter 10.

The excitation signal 11, which generally corresponds or mimics the function of the vocal folds, is altered by lattice filter 10. Lattice filter 10 generally corresponds or mimics the function of the vocal track which filters the sounds generated at the vocal folds. The filter coefficients, $K_1$-$K_n$, reflect the shape (i.e. the resonances) of the vocal track during speech. Accordingly, coefficients $K_1$-$K_n$ are periodically updated to reflect the changing shape of the vocal track and may be stored along with the voicing/unvoicing source data in a read-only-memory.

Referring now to FIG. 1b, there is shown in graphical form the outputs of unvoicing source 16 and voicing source 15 against time. Here voicing source 15 is shown as outputting an impulse at a five millisecond period, which corresponds to a frequency of 200 Hz; this pitch corresponds to voiced sounds in the vocal range of many women. Since men typically have a lower pitch, a man's voicing source would output impulses less frequently.

Voicing source 15 is shown as outputting impulses at a period corresponding to the pitch of the person's voice; it is to be understood, however, that the periodic impulses may be replaced with other periodic functions, such as a decaying sine wave or the so-called "chirp function", which restart with a pitch related period. Unvoicing source 16 is shown as a random signal.

The coefficients for lattice filter 10 are shown as being updated every five milliseconds in FIG. 1b. It is to be understood, however, that the rate of which the coefficients of lattice filter 10 are updated is a design choice. If the coefficients are updated more frequently, the more closely lattice filter 10 will model the vocal track dynamics, but with a corresponding increase in the amount of data to be stored in the aforementioned ROM. Of course, updating the coefficients less frequently has the opposite effect. However, it has been found that by updating the coefficients approximately every five milliseconds or so results in very high quality human speech being synthesized by lattice filter 10 with reasonable data storage requirements.

The time axis of FIG. 1b is shown as being divided into a hundred microsecond intervals. These intervals correspond to the data rate from voicing source 15 and unvoicing source 16 as well as the data rate to and from lattice filter 10. Further, while unvoicing source 16 and voicing source 15 may appear to be analog signals in FIG. 1b, it is to be appreciated that they are in fact digital signals whose magnitudes are as shown and which are updated at the intervals shown along the time axis of FIG. 1b. For information regarding the derivation of the magnitudes of the filter coefficients, reference should be made to the aforementioned "Linear Prediction of Speech."

Thus, in this embodiment, the data rate to cnverter 13 would be 10 KHz and the upper frequency limit of the synthesized speech from converter 13 would be 5 KHz. Of course, the data rate may be altered, if desired, as a matter of design choice. For instance a 8 KHz data rate would result in a synthesizer having an upper frequency response of 4 KHz.

Referring now to FIGS. 2a and 2b, there is shown a block diagram of lattice filter 10. In FIG. 2a lattice filter 10 is shown as comprising ten stages, S1-S10, each of which is equivalent to the stage depicted in FIG. 2b. For ease of illustration, only three of the stages are shown in detail in FIG. 2a. The input to the stage S10 is the excitation signal 11 and the output 12 from the stage S1 is applied to converter 13 (FIG. 1a). It will be appreciated by those skilled in the art that the output 27 from the $S_{10}$ stage is not utilized and therefore adder 27a and multiplier 27b in that stage may be deleted, if desired.

Referring now to FIG. 2b, there is shown a single stage $S_n$ of lattice filter 10. An input to this stage, $Y_{n+1}(i)$, is applied as one input to an adder 18, the output of which is $Y_n(i)$. The other input to adder 18, which is applied to a subtraction input of adder 18, is derived from the output of a multiplier 19 which multiplies the coefficient $K_n$ times the output from a delay circuit 22, bhich output is $b_n(i-1)$. The output from delay circuit 22 is also applied to an adder 21 which also receives as an input the output from a multiplier 20. Multiplier 20 multiplies the coefficient $K_n$ times the output from adder 18, which is, of course, $Y_n(i)$. The output from adder 21 is $b_{n+1}(i)$. As can be seen, the subscript of the Y and b data defines the stage in which that data is utilized while the number appearing in the parenthesis indicates the cycle in which that data was generated. Delay circuit 22 provides a one time cycle delay function, such as may be supplied by a shift register, for example. Once each time cycle a new data point U(i) (or $Y_{11}(i)$) is provided to stage $S_{10}$ as the excitation signal 11. Thus, for each stage in lattice filter 10, two multiplications and two additions must be accomplished during each cycle, that is, given the data rates depicted in FIG. 1b, those four operations must be accomplished in 100 microseconds in each stage of lattice filter 10. As a matter of design choice, lattice filter 10 in FIG. 2a is shown as having ten stages; however, it will be appreciated by those skilled in the art, that the number of stages may be varied as a design choice according to the quality of sound desired to be synthesized by lattice filter 10. It has been found that a ten stage lattice filter 10 can synthesize speech which is virtually indistinguishable from actual human speech.

It will be appreciated then that during any given time cycle, the ten stage lattice filter 10 must accomplish twenty multiplications and twenty addition/subtraction operations. It should be further appreciated that those operations cannot all be accomplished simultaneously, inasmuch as, $Y_{10}$ must be calculated before $Y_9$, which must be calculated before $Y_8$, etc., during any given time cycle. Also during the same time cycle, the $b_{10}$-$b_1$ data must be calculated and stored in the delay circuits 22 of each stage for use during the next time cycle. The Y and b data defined with respect to FIG. 2b, is also shown for stages $S_1$, $S_9$, and $S_{10}$ in FIG. 2a. Equations expressing the relationship between the various Y and b data are set out in Table I. It should be appreciated that Y and b data as well as the coefficients $K_n$ are multidigit numbers; that coefficients $K_1$-$K_{10}$ may vary between a decimal equivalent of plus and minus one and are periodically updated in a manner to be described.

Referring now to FIG. 3, there is shown, in representative form, various intermediate results attained from the multipliers and adders of lattice filter having N stages, the horizontal axis depicts time while the vertical axis represents the various stages of an N stage lattice filter 10. In the $N^{th}$ stage, for example, the intermediate results, $-K_n \cdot b_n$ and $K_n \cdot Y_n$, which may be generated by multipliers 19 and 20 (FIG. 2b), respectively, and intermediate results $Y_n$ and $b_{n+1}$, which may be obtained from adders 26 and 21 (FIGS. 2b), respectively, are shown. Timewise, the intermediate result $-K_n \cdot b_n$ must be generated before $Y_n$ may be obtained; $Y_n$ must be generated before $K_n \cdot Y_n$ may be generated; and $K_n \cdot Y_n$ must be generated before $b_{n+1}$ may be produced. According to the depicted time scale, addition operations are shown as taking a five microsecond time period while the multiplication operations take a longer time period. As to the relationship of the generation of the intermediate results with respect to the different stages, it can be seen that the $b_n$ output from an add operation must be available before the $-K_n \cdot b_n$ multiply operation is initiated, as is depicted by arrow 25. This fact necessitates that a "no operation" period 23 be inserted between the $b_{n+1}$ add operation and the $-K_n \cdot b_n$ multiply operation, if only one add operation and one multiply operation are to be initiated during any given five microsecond time period, as can be seen from FIG. 3. "No operation" periods 24 are inserted after the other add operation before the following multiply operation for symmetry purposes. Thus, it can be seen that the operations indicated in all the stages of an N stage lattice filter may be accomplished concurrently in the order depicted in FIG. 3 and appropriate intermediate results will become available as needed. FIG. 3 depicts the general nature and applicability of the digital implementation of a multi-stage lattice filter to be described. It is to be appreciated that the representation of FIG. 3 shows those operations accomplished during one of the aforementioned time cycles. The five microsecond time period for an add operation is selected as a design choice because of its compatibility with P-channel MOS integrated circuits. Of course, other time periods may be used if desired.

Figure 4:
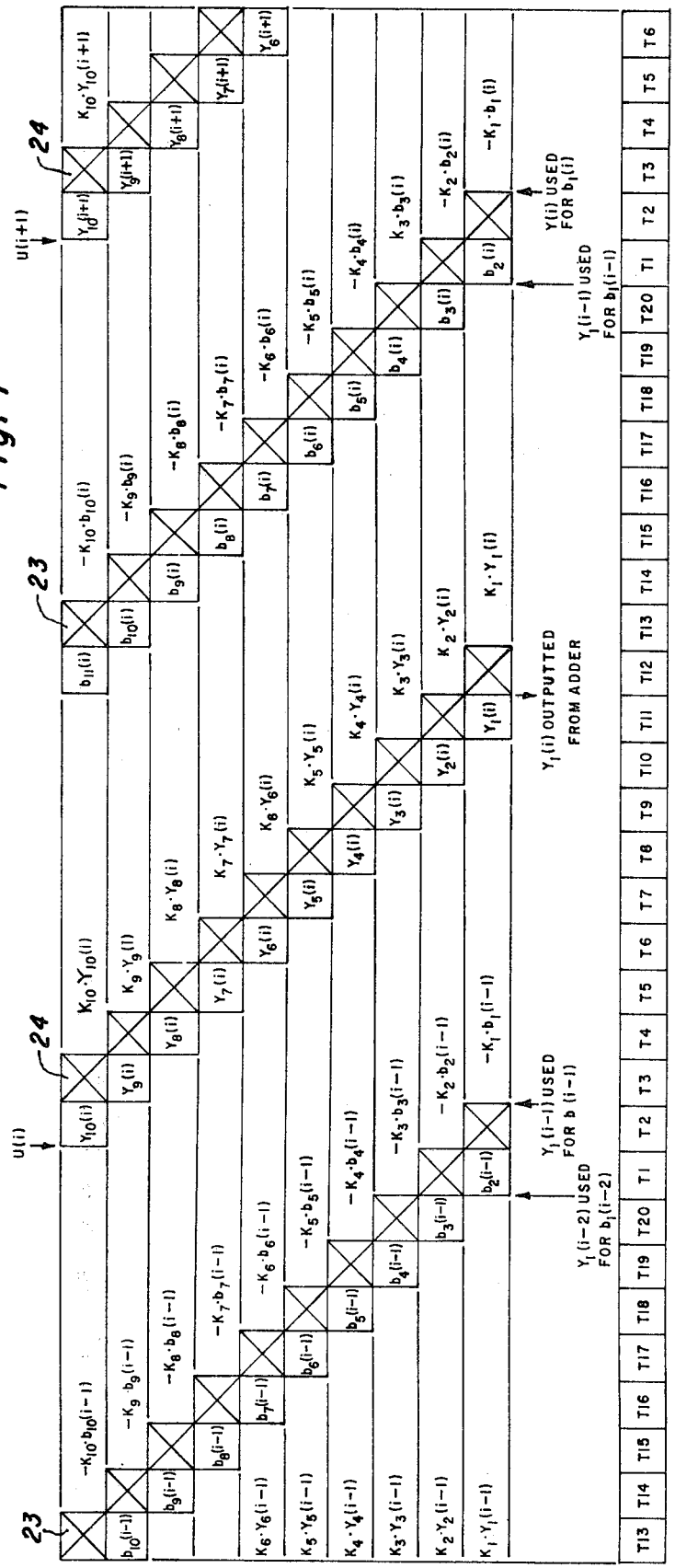
FIG. 4 depicts a timing arrangement for the generation of intermediate results in a lattice filter having ten stages.

Referring now to FIG. 4, there is shown a representation similar to FIG. 3; however, the FIG. 4 representation is for a digital implementation of an equivalent ten stage lattice filter 10 and the horizontal time axis has been increased to show more than one time cycle. Further, the time cycle has been broken down into twenty time periods. T1-T20, each of which preferably has a duration on the order of five microseconds; as has been previously mentioned, other periods may be selected. Also in FIG. 4, the time cycles, e.g., $i-1$, i and $i+1$, are indicated for ease in comparing the availability of intermediate results in filter 10 with the requirements set out by the mathematical formula representation of filter 10 in Table I.

At the first time period, T1, the excitation data U is applied as an input; the output of the filter, $Y_1$, becomes available at time period T11. It can be seen by comparing FIG. 4 and Table I that the various inputs required for the multiply operations are available when needed and that the various inputs for the add operations are also available when needed. It can further be seen from FIG. 4 that an add operation (which preferably takes one time period) is initiated and completed every time period and a multiply operation is similarly initiated (and completed) every time period although the particular multiply operation then being initiated will not be completed for eight time periods. The apparatus for performing these operations will be described in detail with respect to FIGS. 5, 9 and 10a-d.

It has been mentioned that a multiply and an addition operation are each initiated preferably each time period. In fact, the number of time periods in a cycle preferably equals twice the number of stages in the equivalent lattice filter. Thus for eight or twelve stage lattice filters, the equivalent digital filter preferably has sixteen or twenty-four time periods per cycle, respectively. It should be evident from examining FIGS. 3 and 4, that the number of time periods allotted for the multiply operation depends, in part, on the number of time periods in a cycle. Thus, eight time periods may be used for multiply operations in a ten stage equivalent digital filter while six time periods may be used for multiply operations in an eight stage equivalent digital filter, if the digital equivalent filter scheme of FIGS. 3 and 4 is followed. It should be evident to those skilled in the art, however, that the number of time periods for multiply operation tends to dictate the number of bits which may be multiplied, i.e., tends to limit the number of bits used to represent the $K_n$ coefficients. In most applications, the number of bits allotted to the $K_n$ coefficients by following the processing scheme of FIGS. 3 and 4 will yield very acceptable synthesized speech. If, however, even greater accuracy is desired in representing the $K_n$ coefficients, a multiply and a addition operation may not be initiated every time period of a cycle and some delay should be inserted at some point during the cycle. Of course, then the cycle would take a longer time to complete, thereby lowering the data rate (and frequency response) of the system.

As can be seen from FIG. 4, the $K_{10} \cdot Y_{10}$ and $b_{11}$ intermediate results are obtained or may be obtained; however, as mentioned with respect to FIG. 2a, these particular intermediate results are not required for a digital implementation of the lattice filter. It will be seen with respect to FIG. 5, however, that the $K_{10} \cdot Y_{10}$ and $b_{11}$ intermediate results (or some other numbers) are often more easy to generate (and ignore) that it is to inhibit the apparatus from making these calculations. Further, it will be subsequently described how the multiply operation performed by multiplier 18 (FIG. 1) may be accomplished in lieu of calculating $K_{10} \cdot Y_{10}$ by the apparatus.

Figure 5:
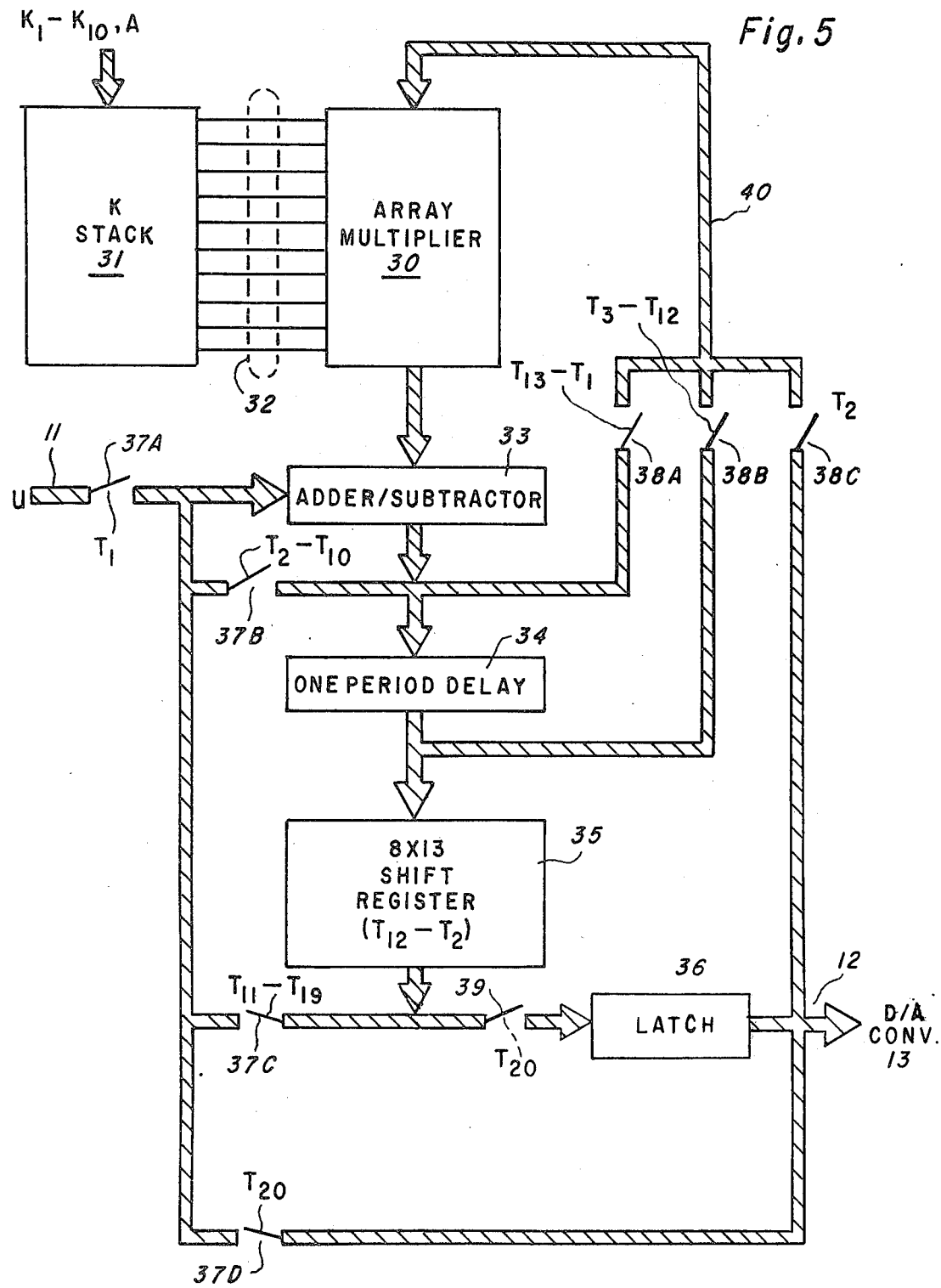
FIG. 5 shows one embodiment of an digital filter equivalent to a lattice filter.
Figure 6:
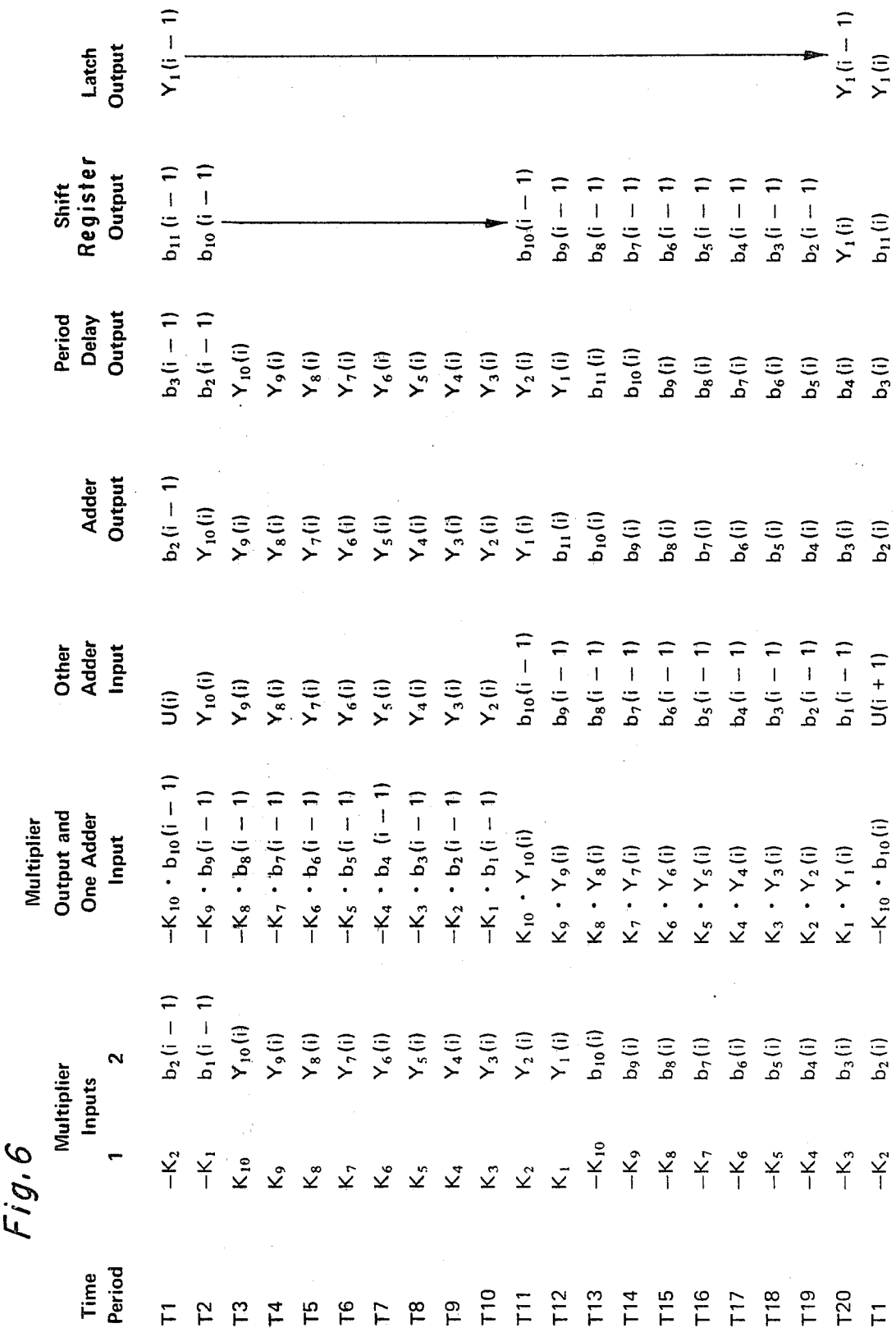
FIG. 6 lists the various intermediate results available in the filter of FIG. 5 at various time periods of a cycle.

In FIG. 5 there is shown a block diagram of a digital implementation of an equivalent lattice filter 10. The filter includes an array multiplier 30, adder/subtractor circuit 33, one period delay circuit 34, a shift register 35, and a latch memory 36. The data inputted to and outputted from these various units at each of the twenty time periods T1–T20 (for an equivalent ten stage lattice filter) are listed in FIG. 6. Referring now to FIGS. 5 and 6, array multiplier 30 accomplishes the multiplications performed by multipliers 19 and 20 (FIGS. 2a and 2b) in each of the stages of the lattice filter. The array multiplier receives the coefficients $K_1$–$K_{10}$, which are stored in K-stack 31, via lines 32 and either $Y_n$ or $b_n$ data via bus 40. K-stack 31 preferably comprises ten shift registers, each of which has ten stages. The data stored in K-stack 31 is depicted in Table II and transmitted to array multiplier 30 via lines 32. Array multiplier 30 initiates a different multiplication operation every time period (as indicated by FIG. 4) i.e., approximately every five microseconds. Array multiplier 30, as will be seen with respect to FIG. 9 preferably has eight stages; a series of addition and shift operations accomplished as the data propagates through these eight stages, the data is multiplied by the appropriate Kn coefficient stored in K-stack 31. The multiply operation takes 40 microseconds; however, since a new multiplication operation is initiated every five microseconds, eight multiplications are in various stages of completion at any given time. The eight time period computation period of array multiplier 30 can be seen with respect to the multiplier inputs and outputs in FIG. 6. For example, the multiplier inputs at time period T1 are outputted from multiplier eight time periods later, at T9. The coefficients stored in K-stack 31 are stored as a nine bit number plus an additional bit for sign information. As aforementioned, these nine bit numbers range from $-1$ to $+1$, (decimal equivalents), which, as will be seen, simplifies the structure of array multiplier 30.

The output of array multiplier 30 is applied to adder/subtractor circuit 33. This output, in the preferred embodiment, is a thirteen bit parallel channel: twelve bits of data and one bit for sign information. It will be appreciated by those skilled in the art, moreover, that the number of bits in the data channel are a design choice. The other input to adder/subtractor circuit is provided from (1) the exictation signal 11 at time period T1, the output of adder/subtractor circuit 33 during time periods T2–T10, the output of shift register 35 during time periods T11–T19 and the output of latch 36 at T20. The particular input to adder/subtractor circuit 33 is shown, for ease of illustration, as being controlled by various single-pole, single throw switches 37a–37d; however, it should be appreciated that solid stage switches would preferably be used to perform these switching functions, as well as the other depicted switching functions. The output of adder/subtractor circuit 33 is applied to switch 37b, switch 38a and as the input to one period delay circuit 34. The output from adder/subtractor circuit 33 is also a thirteen bit wide parallel channel which is delayed by one time period in circuit 34 before being applied as the input to shift register 35 and to switch 38b. Shift register 35 stores the data from the thirteen bit wide channel in thirteen shift registers, each of which has eight stages. Shift register 35 is arranged to perform shift operation only during time periods T12–T2. The output of shift register 35 is applied to switch 37c and switch 39. Switch 39 closes at time period T20 for clocking the output of the filter, $Y_1$, into latch memory 36. The output 12 of latch memory 36 is applied to digital to analog converter 13 (FIG. 1a) and to switches 37d and 38c.

Switch 37b is closed during time periods T2–T10, switch 37c is closed during time periods T11–T19 and switch 37d is closed at time period T20. Switch 38a is closed during time periods T13–T1, switch 38b is closed between time periods T3–T12 and switch 38c is closed for time period T2. The other sides of switches 38a, 38b and 38c are connected to the input to array multiplier 30 via bus 40.

In FIG. 6 there is listed the various intermediate results occurring in the circuit of FIG. 5 during time periods T1–T20. Referring briefly to FIG. 6, it can be seen that one of the multiplier inputs is the $K_n$ coefficient information while the other input varies according to which switch 38a–38c is closed. At time period T1 switch 38a is closed, as aforementioned, so that the output of the adder/subtractor 33, in this case $b_2(i-1)$, is applied as a multiplier input. At the same time the other adder input is the excitation signal $U(i)$. At time period T2, the other multiplier input is $b_1(i-1)$ which, according to FIG. 5, is being loaded from the output of latch 36 via switch 38c. The output of latch 36 according to FIG. 6 is then $Y_1(i-1)$, but recalling the last entry in Table I, it is to be remembered that $b_1(i-1)$ is set equal to a delayed $Y_1(i)$, i.e., $Y_1(i-1)$. Also at time period T2, the other adder input is that which is being currently outputted at the adder output, i.e., in this case, $Y_{10}(i)$. At time period T3 the multiplier inputs are $K_{10}$ and $Y_{10}(i)$, which is derived from the output of one period delay circuit 34. Of course, the results of this multiplication will not be available until time period T11, at which time it will be provided as one of the inputs to adder/subtractor circuit 33. At time period T11 the other input to adder/subtractor circuit 33 is taken from the output of shift register 35. The first term loaded from shift register 35 is the $b_{10}(i-1)$ term which was first outputted from shift register 35 at time period T2 and remained at the output thereof since shift register 35, as aforementioned, does not shift between time periods T3 and T11.

At time period T13 the input to array multiplier 30 is again provided from the output of adder/subtractor circuit 33 via switch 38a. At time period T20 the $Y_1(i)$ term is outputted to latch memory 36 from shift register 35 and the current output of latch 36, $Y_1(i-1)$ is applied to the other input to adder/subtractor circuit 33 via switch 37d for providing the $b_1(i-1)$ term, as aforementioned. Latch memory 36 stores the filter output ($Y_1$) for one cycle.

Figure 11:
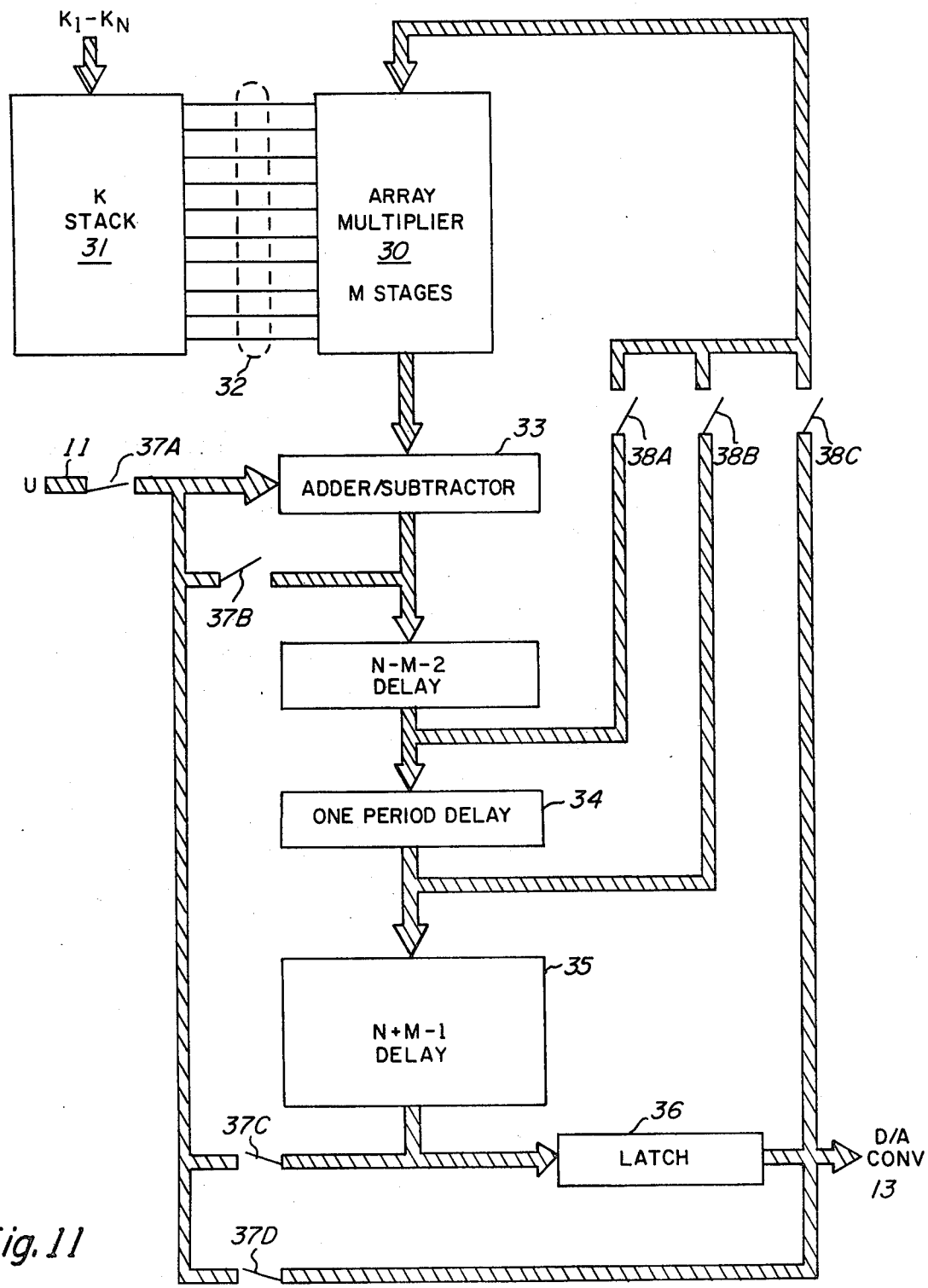
FIG. 11 depicts a generalized form of the digital filter.

The block diagram of FIG. 5 has been previously explained. The filter of FIG. 5 may also be utilized in an application equivalent to a N-stage filter having an M-stage multiplier (e.g., there may be M+2 bits in the $K_n$ coefficients), if a shift register having a delay equivalent to $N-M-2$ time periods is inserted between adder/subtractor circuit 33 and one period delay circuit 34. The connection to switch 38A is then made from the output of the adder shift register and the delay associated with shift register 35 should then be set equal to $N+M-1$. This generalized form of the digital filter is depicted in FIG. 11. In the embodiment of FIG. 5, $N-M-2$ is equal to zero, so no delay is required in that embodiment. In the embodiment described with reference to FIGS. 5 and 6, $N+M-1$ equals seventeen which reflects the number of time periods between the time data is applied to shift register 35 and the time that data exits shift register 35. For instance, in FIG. 6, the $b_2(i-1)$ data is inserted into shift register 35 at time period T2 and exits shift register 35 at time period T19, seventeen time periods later. However, shift register 35 only has eight stages in this embodiment, the additional delay occuring during the T3-T11 time periods that shift register 35 is not shifted. These nine time periods correspond to when the Y2-Y10 data is available at the output of one period delay circuit 34, which data need not be inputted into shift register 35, as can be seen in FIG. 6. Thus, the number of stages in shift register 35 plus the number of time periods per cycle that data is not shifted in shift register 35 (if any) equals the $N+M-1$ time period delay through shift register 35.

As can be seen, the equivalent ten stage lattice filter of FIGS. 5 and 6 performs the filtering operation required by the lattice filter 10 of FIG. 1a at reasonable data rates. For example, in the preferred embodiment, excitation data 11 is applied at a ten kilohertz rate (i.e. every 100 microseconds) and the basic addition operations in adder/subtractor circuit 33 as well as in array multiplier 30 and the shift operations in one period delay circuit 34 and shift register 35 are accomplished in nominal five microsecond time periods. As is well known to those skilled in the art, such speeds are well within the speed capabilities of P-channel MOS large scale integration devices so that the filter of FIG. 5 may be incorporated in a relatively inexpensive P-channel MOS LSI speech synthesis or complex waveform generation chip.

It should also be evident to those skilled in the art, that the basic arrangement of the ten stage equivalent lattice filter of FIG. 5 is also applicable to digital filters equivalent to lattice filters having other numbers of stages. Ten stages were selected for the preferred embodiment of the filter, inasmuch as ten stage lattice filters for linear predictive coding speech synthesis circuits have been selected as the standard for use by the Department of Defense of the U.S. Government. However, should those wishing to practice this invention desire to utilize a digital lattice filter having a different number of equivalent stages, it is noted that the number of time periods into which a cycle is divided should at least equal to twice the number of equivalent stages. Thus, in the preferred embodiment, the number of time periods (twenty) equals twice the number of equivalent stages (ten). For example, if a twelve stage equivalent filter were desired, the number of time periods per cycle should be at least twenty-four and the basic design heretofore described would merely be expanded. It is noted that for a twelve stage equivalent digital lattice filter that the array multiplier 30 thereof could utilize ten time periods to complete a multiplication if the basic scheme heretofore described is followed i.e., one addition and one multiplication operation is initiated each time period. This can be seen from FIG. 3 by setting N equal to twelve and completing the FIG. 3 diagram accordingly. Of course, if the five microsecond period for each time period were maintained, the data rates which may be accomodated by the twelve stage version would be less than that for the ten stage version of the filter. It should be also noted that by increasing the delay time through the array multiplier 30, that the number of bits in the $K_1$-$K_{12}$ coefficients could be increased from a total of ten bits to a total of twelve bits. Similarly, if an eight stage equivalent digital filter were desired, the number of time periods in a cycle would then be at least sixteen and by setting N equal to eight in FIG. 3 it can be seen that the propagation time through multiplier 30 would then be six time periods. In that case, using the array multiplier, which is subsequently described in detail, would limit the number of bits in the coefficients from K-stack 31 to having no more than eight bits. However, as was previously mentioned with respect to FIG. 4, even more time periods may be used to accomplish a multiply operation in certain embodiments. This may be desired here, as a design choice, if additional accuracy is desired in the $K_n$ coefficients. The additional accuracy would require more bits in the $K_n$ coefficients, which inturn, requires more delay through array multiplier 30. The basis design of equivalent filter of FIG. 5 would be modified somewhat because then a multiply and an addition operation would not be initiated every time period. It should be evident to those skilled in the art, that in that case, some of the intermediate results obtained within the filter would have to be stored temporarily, thereby, requiring additional storage elements to be included in the filter of FIG. 5. While such modifications are not spelled out here in detail, such modification to the digital implementation of lattice filter should be within the skill of knowledgeable digital circuit designers.

Figure 7:
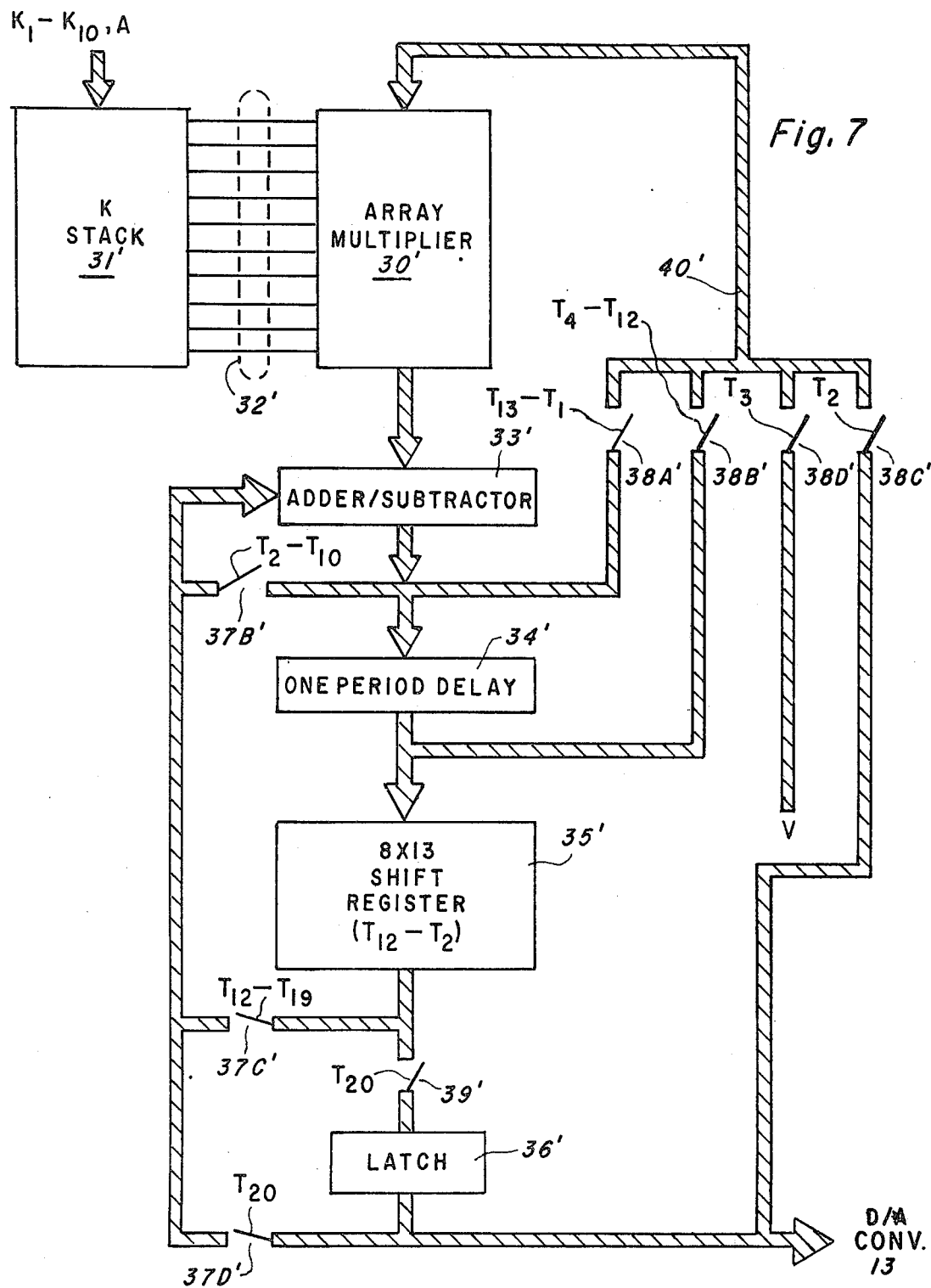
FIG. 7 shows another embodiment of a digital filter equivalent to a lattice filter.
Figure 8:
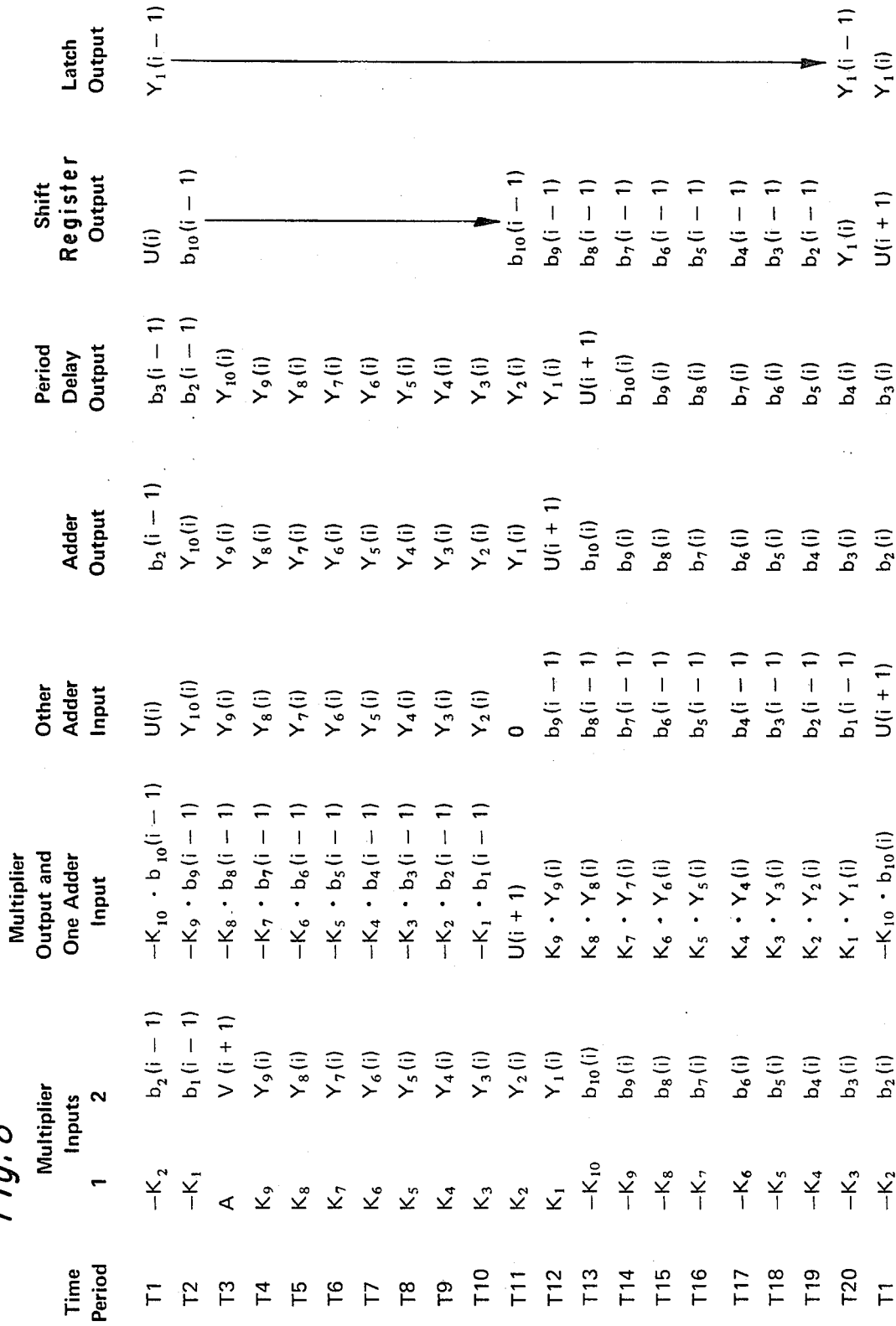
FIG. 8 lists the various intermediate results available in the filter of FIG. 7 at various time periods of a cycle.

It has previously been mentioned that the $K_{10} \cdot Y_{10}(i)$ and $b_{11}(i)$ intermediate results are generated by the digital filter of FIG. 5, but these intermediate results are not utilized inasmuch as they are not required to implement lattice filter 10 of FIG. 1a. Now, recalling that the data (V) from the voicing or unvoicing source is multiplied by an amplification factor (A) by a multiplier 18 in the conventional speech synthesis circuit of FIG. 1a, it has been found that this multiplication may be done by array multiplier 30 during the time that $K_{10} \cdot Y_{10}(i)$ would otherwise be generated by the array multiplier. An embodiment of the digital filter performing this multiplication $V(i) \cdot A$ is shown in FIG. 7. In FIG. 8, there is shown the various intermediate results generated in the circuit of FIG. 7.

Referring now briefly to FIGS. 7 and 8, it can be seen that this circuit (including the intermediate results generated thereby) is similar to the circuit of FIG. 5, with the following modifications. The identification numerals of FIG. 7 are generally the same as used in FIG. 5, but have a prime added thereto for ease of identification. The data (V) to be multiplied by amplification factor A is applied to one input of array multiplier 30' via a switch 38d' at time period T3 in lieu of applying the output of the one period delay circuit 34 at that time. At time period T11, when the multiplication has been completed to form $U(i+1)$, i.e., $A \cdot V(i+1)$, logical zeroes are inputted to the other input of adder/subtractor circuit 33' in lieu of inputting the $b_{10}(i-1)$ in data from shift register 35. Also, of course, both $K_n$ coefficient data and A amplification data must be inputted to K-stack 31'. As can be seen from FIGS. 7 and 8, this embodiment incorporates the function performed by multiplier 18 (FIG. 1a) into the digital implementation of lattice filter 10. The data stored in K-stack 31' is depicted in Table III. The amplification factor A is preferably updated at the same rate as the Kn coefficients are updated in K-stack 31'.

Figure 9:
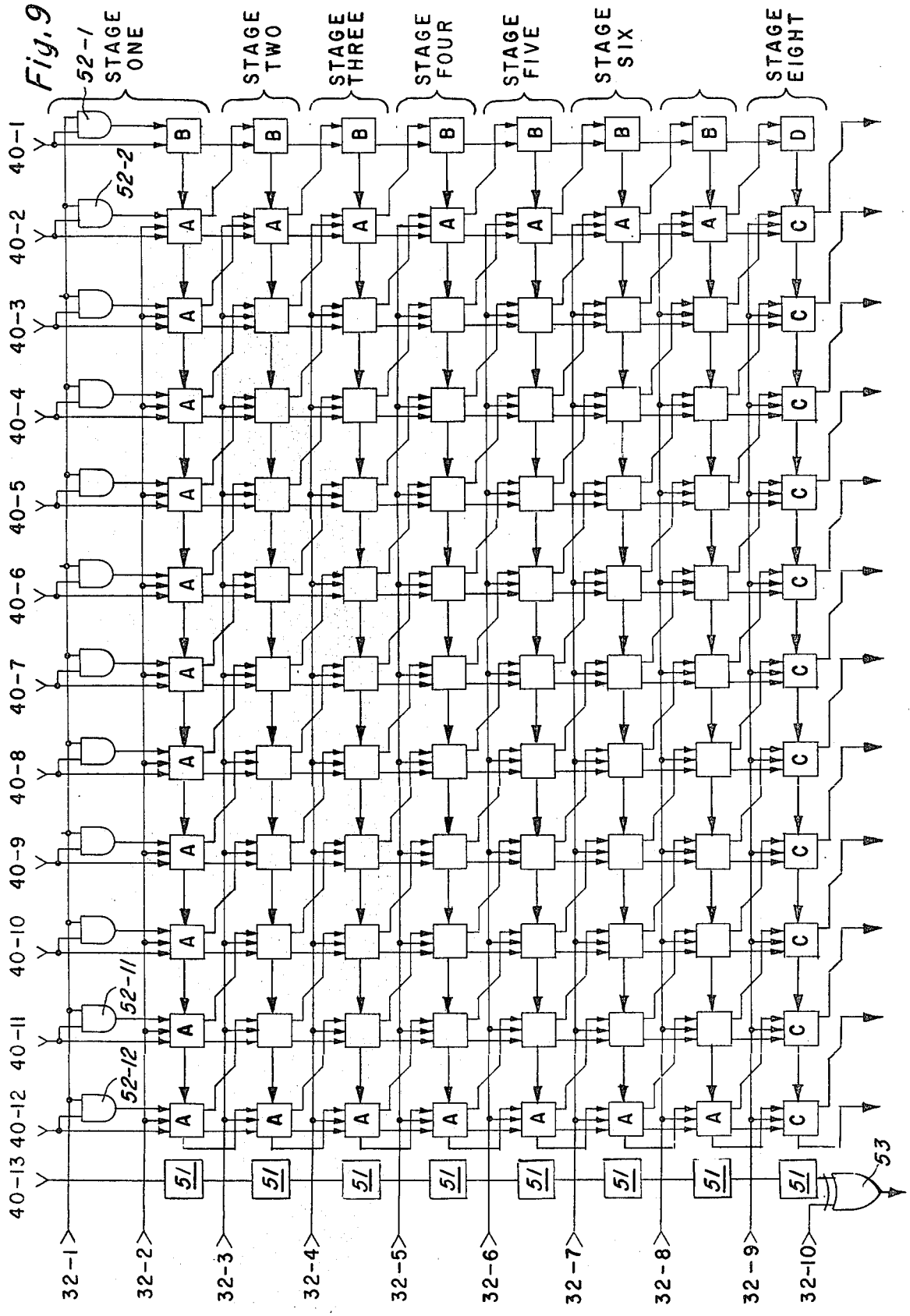
FIG. 9 depicts the array multiplier used in the digital equivalent filter.

Referring now to FIG. 9, there is shown, in block diagram form, array multiplier 30. Lines 32-1 through 32-9 receive the least significant through most significant bits, respectively of coefficient data from K-stack 32. On lines 32-10 is received the sign data from K-stack 31. Another input to array multiplier 30 is received via bus 40. Lines 40-1 through 40-12 of bus 40 carry the least significant through most significant bits, respectively, and line 40-13 carries the sign of the data on bus 40.

Figure 10:
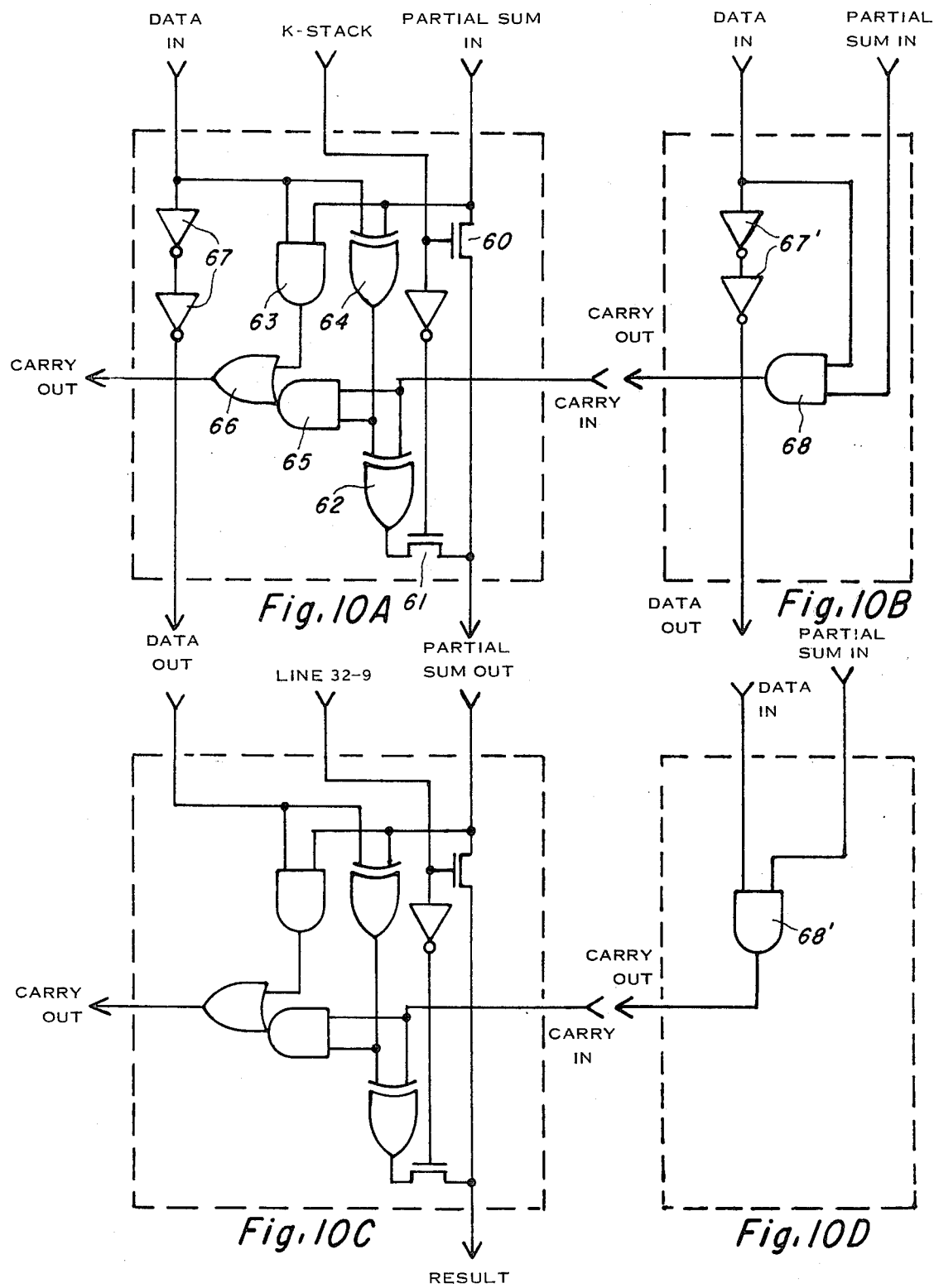
FIGS. 10a-10d are logic diagrams of the various elements depicted in FIG. 9.

In FIG. 9, there is an array of elements having reference letters A, B, C, or D (the elements with no reference letter are also "A" type elements, e.g., also correspond to FIG. 10a). These elements A–D, correspond to the circuits of FIGS. 10a–10d, respectively. Referring briefly to FIGS. 10a–10d, the circuits thereof are each enclosed via a dashed line with certain conductors extending across the dashed line. The relative position of the conductors extending across the dashed line of FIGS. 10a–10d correspond location-wise to the conductors contacting elements A–D in FIG. 9. In FIG. 9, the elements are arranged in eight rows and twelve columns. The eight rows correspond to the eight previously mentioned eight stages of array multiplier 30. These stages are identified on the right-hand side of FIG. 9 and include the eight shift register cells 51 coupled to line 40-13. The twelve columns correspond to the twelve bits of numeric data (on lines 40-1 through 40-12) inputted to array multiplier 30. The data on lines 40-1 through 40-13 propagate through array multiplier 30 stage-by-stage in a shift register fashion as it is being multiplied in array multiplier 30. Thus, the propagation time through any given stage is on the order of the aforementioned five microseconds or so.

Lines 32-1 from K-stack 31 is coupled to one input of twelve AND gates 52-1 through 52-12, the other input of each one being connected to lines 40-1 through 40-12, respectively. The outputs of AND gates 52-12 through 52-1 are applied to the partial sum inputs of the type A and B elements of stage 1 (See FIGS. 10a and 10b).

Lines 32-2 through 32-8 are coupled to the K-stack inputs of the A type elements (FIG. 10a) in stages 1–7, respectively, of array multiplier 30. Line 32-9 is coupled to the input therefrom in the C type elements of stage 8 (See FIG. 10c). The data on lines 40-1 through 40-12 is coupled to the "data-in" inputs of the stage 1 elements and coupled therethrough to stage 2 through stage 8 elements by the "data-out" terminals of those elements. The partial sum input of the stage 1 elements is derived from the outputs of AND gates 52-1 through 52-12. In the following stages the partial sum input is derived from the partial sum output from the next more significant bit of the prior stage, with the exception of the partial sum input of element in the most significant bit position whose partial sum input is derived from the carry output from the most significant bit position in the prior stage. Otherwise, the carry-out connections from the elements are serially connected to the carry-in connections in each stage.

Referring now briefly to FIG. 10a, the data from K-stack 31 determines whether the "partial sum" is to be directly connected to the "partial sum" via a transfer gate 60 or to the output from exclusive OR gate 62 via a transfer gate 61. An AND gate 63 and an exclusive OR gate 64 are responsive to the data on "data-in" and "partial sum in". Exclusive OR gate 62 is responsive to the output from exclusive OR gate 64 and to "carry-in". An AND gate 65 is responsive to the output of exclusive OR gate 64 and to "carry-in" and the output thereof is provided alone with the output from AND gate 63 to an OR gate 66, whose output is "carry-out." "Data-out" corresponds to "data-in" delayed by a shift register section 67 comprising two inverters, for instance. As can be seen from FIG. 10c, a C type element is identical to an A type element with the exception that no "data-out" connection is provided nor is a shift register 67 provided. In FIG. 10b, a B type element is shown which merely provides a "data-out" connection coupled to a shift register 67' whose input is "data-in" and a "carry-out" connection provided by an AND gate 68 whose inputs are "data-in" and "partial sum in". In FIG. 10d, the D type element provides merely a "carry-out" signal from an AND gate 68' whose inputs are "data-in" and "partial sum in".

As can be seen, a new partial sum is calculated at each stage, including a necessary transfer of carry information between elements of a stage, but the "partial sum out" remains unchanged if the data on the K-stack line is a logical zero or is added to the data on "data-in" to provide the "partial sum out" if the data on the line from K-stack 31 is a logical 1. The partial sums are shifted to succeedingly less significant places as data is shifted through the array multiplier. Of course, a least significant bit is lost in each stage of the array multiplier. However, the Kn coefficient data from K-stack 31 corresponds to a number in the decimal range of $-1$ to $+1$; thus if logical zeroes appear on lines 32-1 through 32-9, the output from array multiplier 30 will be a logical zero and conversely, if the data on lines 32-1 through 32-9 are all logical ones, the data inputted on bus 40 will be outputted from array multiplier 30 unchanged. For the other possible data patterns on lines 32-1 through 32-9, the data on bus 40 will be scaled between zero and the inputted value on bus 40 in $2^9$ possible steps, according to the magnitude of the data on line 32-1 through 32-9.

Inasmuch as the data shifts through array multiplier 30 stage-by-stage in a shift register fashion, the data from K-stack 31 is skewed as shown in Table II and III, for instance, to assure that the appropriate bit of the appropriate coefficient arrives at the appropriate time in array multiplier 30. In FIGS. 10a–10c the timing pulses for operating those circuits in the aforementioned shift register fashion is not depicted here, for, as is well known to those skilled in the art, such timing function may be provided by adding clocked gates to the circuits of FIGS. 10a–10c or by utilizing precharge and conditional discharge type logic, and therefore such timing considerations are not shown here in detail.

Referring again briefly to FIG. 9, the sign data on lines 40-13 is merely delayed during the eight stage delay or array multiplier 30 via shift register elements 51 and then compared with the sign data from K-stack 31 on line 32-10 at exclusive OR gate 53, thereby providing a correct sign of the outputted data according to the normal rules of multiplication.

Referring again briefly to FIGS. 5 and 7, the array multiplier 30 (or 30') thereof has been described in detail. The remaining elements, such as the adder/subtractor circuit 33 (or 33'), the one period delay circuit 34 (or 34'), shift register 35 (or 35') and latch memory 36 (or 36') are not shown in such detail, since such conventional elements are well known. The adder/subtractor circuit 33 (or 33') receives signed data on its two inputs and should determine whether a subtraction or addition operation is called for based on the particular sign inputted with the data.

Having described the invention with respect to several embodiments thereof, additional modification may now suggest itself to those skilled in the art. The invention is not to be limited to the particular embodiments described, except as set forth in the appended claims.

TABLE I

| EQUATION | STAGE |
|---|---|
| $Y_{10}(i) = Y_{11}(i) - K_{10}b_{10}(i-1)$ | 10 |
| $Y_9(i) = Y_{10}(i) - K_9 b_9(i-1)$ | 9 |
| $b_{10}(i) = b_9(i-1) + K_9 Y_9(i)$ | 9 |
| $Y_8(i) = Y_9(i) - K_8 b_8(i-1)$ | 8 |
| $b_9(i) = b_8(i-1) + K_8 Y_8(i)$ | 8 |
| $Y_7(i) = Y_8(i) - K_7 b_7(i-1)$ | 7 |
| $b_8(i) = b_7(i-1) + K_7 Y_7(i)$ | 7 |
| $Y_6(i) = Y_7(i) - K_6 b_6(i-1)$ | 6 |
| $b_7(i) = b_6(i-1) + K_6 Y_6(i)$ | 6 |
| $Y_5(i) = Y_6(i) - K_5 b_5(i-1)$ | 5 |
| $b_6(i) = b_5(i-1) + K_5 Y_5(i)$ | 5 |
| $Y_4(i) = Y_5(i) - K_4 b_4(i-1)$ | 4 |
| $b_5(i) = b_4(i-1) + K_4 Y_4(i)$ | 4 |
| $Y_3(i) = Y_4(i) - K_3 b_3(i-1)$ | 3 |
| $b_4(i) = b_3(i-1) + K_3 Y_3(i)$ | 3 |
| $Y_2(i) = Y_3(i) - K_2 b_2(i-1)$ | 2 |
| $b_3(i) = b_2(i-1) + K_2 Y_2(i)$ | 2 |
| $Y_1(i) = Y_2(i) - K_1 b_1(i-1)$ | 1 |
| $b_2(i) = b_1(i-1) + K_1 Y_1(i)$ | 1 |
| $b_1(i) = Y_1(i)$ | |

TABLE II

DATA OUTPUTTED FROM K-STACK 31 BY TIME PERIODS

| K-STACK OUTPUT | | TIME PERIOD | | | | | | | | | |
|---|---|---|---|---|---|---|---|---|---|---|---|
| | | T1 | T2 | T3 | T4 | T5 | T6 | T7 | T8 | T9 | T10 |
| Bit | Line | T11 | T12 | T13 | T14 | T15 | T16 | T17 | T18 | T19 | T20 |
| LSB | 32-1 | $K_2$ | $K_1$ | $K_{10}$ | $K_9$ | $K_8$ | $K_7$ | $K_6$ | $K_5$ | $K_4$ | $K_3$ |
| | 32-2 | $K_2$ | $K_1$ | $K_{10}$ | $K_9$ | $K_8$ | $K_7$ | $K_6$ | $K_5$ | $K_4$ | $K_3$ |
| | 32-3 | $K_3$ | $K_2$ | $K_1$ | $K_{10}$ | $K_9$ | $K_8$ | $K_7$ | $K_6$ | $K_5$ | $K_4$ |
| | 32-4 | $K_4$ | $K_3$ | $K_2$ | $K_1$ | $K_{10}$ | $K_9$ | $K_8$ | $K_7$ | $K_6$ | $K_5$ |
| | 32-5 | $K_5$ | $K_4$ | $K_3$ | $K_2$ | $K_1$ | $K_{10}$ | $K_9$ | $K_8$ | $K_7$ | $K_6$ |
| | 32-6 | $K_6$ | $K_5$ | $K_4$ | $K_3$ | $K_2$ | $K_1$ | $K_{10}$ | $K_9$ | $K_8$ | $K_7$ |
| | 32-7 | $K_7$ | $K_6$ | $K_5$ | $K_4$ | $K_3$ | $K_2$ | $K_1$ | $K_{10}$ | $K_9$ | $K_8$ |
| | 32-8 | $K_8$ | $K_7$ | $K_6$ | $K_5$ | $K_4$ | $K_3$ | $K_2$ | $K_1$ | $K_{10}$ | $K_9$ |
| MSB | 32-9 | $K_9$ | $K_8$ | $K_7$ | $K_6$ | $K_5$ | $K_4$ | $K_3$ | $K_2$ | $K_1$ | $K_{10}$ |
| SIGN BIT | 32-10 | $K_9$ | $K_8$ | $K_7$ | $K_6$ | $K_5$ | $K_4$ | $K_3$ | $K_2$ | $K_1$ | $K_{10}$ |

TABLE III

DATA OUTPUTTED FROM K-STACK 31' BY TIME PERIODS

| K-STACK OUTPUT | | TIME PERIODS | | | | | | | | | | | | | | | | | | | |
|---|---|---|---|---|---|---|---|---|---|---|---|---|---|---|---|---|---|---|---|---|
| Bit | Line | T1 | T2 | T3 | T4 | T5 | T6 | T7 | T8 | T9 | T10 | T11 | T12 | T13 | T14 | T15 | T16 | T17 | T18 | T19 | T20 |
| LSB | 32-1 | $K_2$ | $K_1$ | A | $K_9$ | $K_8$ | $K_7$ | $K_6$ | $K_5$ | $K_4$ | $K_3$ | $K_2$ | $K_1$ | $K_{10}$ | $K_9$ | $K_8$ | $K_7$ | $K_6$ | $K_5$ | $K_4$ | $K_3$ |
| | 32-2 | $K_2$ | $K_1$ | A | $K_9$ | $K_8$ | $K_7$ | $K_6$ | $K_5$ | $K_4$ | $K_3$ | $K_2$ | $K_1$ | $K_{10}$ | $K_9$ | $K_8$ | $K_7$ | $K_6$ | $K_5$ | $K_4$ | $K_3$ |
| | 32-3 | $K_3$ | $K_2$ | $K_1$ | A | $K_9$ | $K_8$ | $K_7$ | $K_6$ | $K_5$ | $K_4$ | $K_3$ | $K_2$ | $K_1$ | $K_{10}$ | $K_9$ | $K_8$ | $K_7$ | $K_6$ | $K_5$ | $K_4$ |
| | 32-4 | $K_4$ | $K_3$ | $K_2$ | $K_1$ | A | $K_9$ | $K_8$ | $K_7$ | $K_6$ | $K_5$ | $K_4$ | $K_3$ | $K_2$ | $K_1$ | $K_{10}$ | $K_9$ | $K_8$ | $K_7$ | $K_6$ | $K_5$ |
| | 32-5 | $K_5$ | $K_4$ | $K_3$ | $K_2$ | $K_1$ | A | $K_9$ | $K_8$ | $K_7$ | $K_6$ | $K_5$ | $K_4$ | $K_3$ | $K_2$ | $K_1$ | $K_{10}$ | $K_9$ | $K_8$ | $K_7$ | $K_6$ |
| | 32-6 | $K_6$ | $K_5$ | $K_4$ | $K_3$ | $K_2$ | $K_1$ | A | $K_9$ | $K_8$ | $K_7$ | $K_6$ | $K_5$ | $K_4$ | $K_3$ | $K_2$ | $K_1$ | $K_{10}$ | $K_9$ | $K_8$ | $K_7$ |
| | 32-7 | $K_7$ | $K_6$ | $K_5$ | $K_4$ | $K_3$ | $K_2$ | $K_1$ | A | $K_9$ | $K_8$ | $K_7$ | $K_6$ | $K_5$ | $K_4$ | $K_3$ | $K_2$ | $K_1$ | $K_{10}$ | $K_9$ | $K_8$ |
| | 32-8 | $K_8$ | $K_7$ | $K_6$ | $K_5$ | $K_4$ | $K_3$ | $K_2$ | $K_1$ | A | $K_9$ | $K_8$ | $K_7$ | $K_6$ | $K_5$ | $K_4$ | $K_3$ | $K_2$ | $K_1$ | $K_{10}$ | $K_9$ |
| MSB | 32-9 | $K_9$ | $K_8$ | $K_7$ | $K_6$ | $K_5$ | $K_4$ | $K_3$ | $K_2$ | $K_1$ | A | $K_9$ | $K_8$ | $K_7$ | $K_6$ | $K_5$ | $K_4$ | $K_3$ | $K_2$ | $K_1$ | $K_{10}$ |
| SIGN BIT | 32-10 | $K_9$ | $K_8$ | $K_7$ | $K_6$ | $K_5$ | $K_4$ | $K_3$ | $K_2$ | $K_1$ | A | $K_9$ | $K_8$ | $K_7$ | $K_6$ | $K_5$ | $K_4$ | $K_3$ | $K_2$ | $K_1$ | $K_{10}$ |

What is claimed is:

1. A system for synthesizing human speech in response to a plurality of digital filter codes and digital excitation signals, said system comprising:
   first digital storage means for storing said plurality of digital filter codes;
   generator means for generating said digital excitation signals;
   digital filter means for implementing a lattice filter coupled to said first digital storage means and said generator means for producing digital signals representative of human speech in response to said plurality of digital filter codes and said digital excitation signals, said digital filter means comprising:
only one arithmetic unit, said arithmetic unit comprising a multiplier, a digital adder, and selective feedback circuitry coupling said adder and said multiplier, said selective feedback circuitry including second digital storage means for storing data outputted from said adder and circuit means selectively coupling the outputs of said adder and said second digital storage means to an input of said multiplier and to an input of said adder, the output of said adder being directly line-coupled to the input of said multiplier in one condition of said selectively coupling circuit means, and the output of said adder being directly coupled to said second digital storage means in another condition of said selectively coupling circuit means;
digital-to-analog converter means coupled to said digital filter means for converting said digital signals representative of human speech into analog signals; and
audio means coupled to said digital-to-analog converter means for converting said analog signals into audible sounds.

2. The system according to claim 1, wherein said first digital storage means comprises non-volatile memory means.

3. The system according to claim 1, wherein said generator means includes both voiced and unvoiced generator means.

4. The system according to claim 1, wherein said plurality of digital filter codes comprises linear predictive coefficients.

5. The system according to claim 1, wherein said audio means comprises a speaker.

6. The system according to claim 1, wherein said digital adder is the only adder in said only one arithmetic unit.

7. The system according to claim 1, wherein said selective feedback circuitry includes variable delay circuitry.

8. A system for synthesizing human speech in response to a plurality of digital filter codes and digital excitation signals, said system comprising:
first digital storage means for storing said plurality of digital filter codes;
generator means for generating said digital excitation signals;
digital filter means for implementing a lattice filter coupled to said first digital storage means and said generator means for producing digital signals representative of human speech in response to said plurality of digital filter codes and said digital excitation signals, said digital filter means comprising: only a single filter stage including:
only one multiplier circuit;
a digital adder circuit; and
selective feedback circuitry coupling said only one multiplier circuit and said digital adder circuit, said selective feedback circuitry including second digital storage means for storing data outputted from said digital adder circuit and circuit means selectively coupling the outputs of said digital adder circuit and said second digital storage means to an input of said only one multiplier circuit and to an input of said digital adder circuit, the output of said digital adder circuit being directly line-coupled to the input of said only one multiplier circuit in one condition of said selectively coupling circuit means, and the output of said digital adder circuit being directly coupled to said second digital storage means in another condition of said selectively coupling circuit means;
digital-to-analog converter means coupled to said digital filter means for converting said digital signals representative of human speech into analog signals; and
audio means coupled to said digital-to-analog converter means for converting said analog signals into audible sounds.

9. The system according to claim 8 wherein said first digital storage means comprises non-volatile memory means.

10. The system according to claim 8 wherein said generator means includes both voiced and unvoiced generator means.

11. The system according to claim 8 wherein said plurality of digital filter codes comprises linear predictive coefficients.

12. The system according to claim 8 wherein said audio means comprises a speaker.

13. The system according to claim 8 wherein said digital adder circuit is the only adder in said single filter stage.

14. The system according to claim 8 wherein said selective feedback circuitry includes variable delay circuitry.

15. The system according to claim 8 wherein said only one multiplier circuit is an array multiplier.

16. A system for synthesizing human speech in response to a plurality of digital filter codes and digital excitation signals, said system comprising:
first digital storage means for storing said plurality of digital filter codes;
generator means for generating said digital excitation signals;
digital filter means coupled to said first digital storage means and said generator means for producing digital signals representative of human speech in response to said plurality of digital filter codes and said digital excitation signals, said digital filter means comprising:
only a single filter stage wherein the only arithmetic circuits are a single multiplier and a single adder, with selective feedback circuitry coupling said single multiplier and said single adder, said selective feedback circuitry including second digital storage means for storing data outputted from said single adder and circuit means selectively coupling the outputs of said single adder and said second digital storage means to an input of said single multiplier and to an input of said single adder, the output of said single adder being directly line-coupled to the input of said single multiplier in one condition of said selectively coupling circuit means, and the output of said single adder being directly coupled to said second digital storage means in another condition of said selectively coupling circuit means;
digital-to-analog converter means coupled to said digital filter means for converting said digital signals representative of human speech into analog signals; and audio means coupled to said digital-to-analog converter means for converting said analog signals into audible sounds.

17. The system according to claim 16 wherein said first digital storage means comprises non-volatile memory means.

18. The system according to claim 16 wherein said generator means includes both voiced and unvoiced generator means.

19. The system according to claim 16 wherein said plurality of digital filter codes comprises linear predictive coefficients.

20. The system according to claim 16 wherein said audio means comprises a speaker.

21. The system according to claim 16 wherein said selective feedback circuitry includes variable delay circuitry.

22. The system according to claim 16 wherein said single multiplier is an array multiplier.

23. A system for synthesizing human speech in response to a plurality of digital filter coefficients and digital excitation signals, said system comprising:
  memory means for storing said plurality of digital filter coefficients;
  generator means for generating said digital excitation signals;
  digital filter means for implementing a lattice filter coupled to said memory means and said generator means for producing digital signals representative of human speech in response to said plurality of digital filter coefficients and said digital excitation signals, said digital filter means comprising only a single filter stage including
    a single multiplier circuit,
    first circuit means for coupling said memory means and said single multiplier circuit,
    an arithmetic circuit having first and second inputs, the first input of said arithmetic circuit being coupled to the output of said single multiplier circuit, and
    selective feedback circuitry coupling said single multiplier circuit and said arithmetic circuit, said selective feedback circuitry including
      digital storage means for storing data outputted from said arithmetic circuit,
      second circuit means for selectively coupling the outputs of said digital storage means and said arithmetic circuit to an input of said single multiplier circuit, the output of said arithmetic circuit being directly line-coupled to the input of said single multiplier circuit in one condition of said selectively coupling second circuit means, and the output of said arithmetic circuit being directly coupled to said digital storage means in another condition of said selectively coupling second circuit means, and
      third circuit means for selectively coupling the outputs of said digital storage means and said arithmetic circuit to the second input of said arithmetic circuit;
  digital-to-analog converter means coupled to said digital filter means for converting said digital signals representative of human speech into analog signals; and
  audio means coupled to said digital-to-analog converter means for converting said analog signals into audible sounds.

24. The system according to claim 23, wherein said digital filter means has only one arithmetic unit including said single multiplier circuit and said arithmetic circuit.

25. The system according to claim 24, wherein said single multiplier circuit of said only one arithmetic unit is an array multiplier, and said arithmetic circuit of said only one arithmetic unit is a digital adder.

26. The system according to claim 23, wherein said memory means comprises non-volatile memory means.

27. The system according to claim 23, wherein said generator means includes both voiced and unvoiced generator means.

28. The system according to claim 23, wherein said plurality of digital filter coefficients comprises linear predictive coefficients.

29. The system according to claim 23, wherein said audio means comprises a speaker.

30. The system according to claim 23, wherein said selective feedback circuitry further includes variable delay circuitry.

* * * * *